(12) United States Patent
Lim et al.

(10) Patent No.: US 11,075,206 B2
(45) Date of Patent: Jul. 27, 2021

(54) SRAM SOURCE-DRAIN STRUCTURE

(71) Applicant: QUALCOMM Incorporated, San Diego, CA (US)

(72) Inventors: Kwanyong Lim, San Diego, CA (US); Youn Sung Choi, San Diego, CA (US); Ukjin Roh, San Diego, CA (US)

(73) Assignee: Qualcomm Incorporated, San Diego, CA (US)

(*) Notice: Subject to any disclaimer, the term of this patent is extended or adjusted under 35 U.S.C. 154(b) by 65 days.

(21) Appl. No.: 16/220,096

(22) Filed: Dec. 14, 2018

(65) Prior Publication Data
US 2020/0194440 A1    Jun. 18, 2020

(51) Int. Cl.
| | | |
|---|---|---|
| *H01L 27/11* | (2006.01) | |
| *H01L 29/66* | (2006.01) | |
| *H01L 29/78* | (2006.01) | |
| *H01L 21/8238* | (2006.01) | |
| *H01L 29/06* | (2006.01) | |
| *H01L 29/08* | (2006.01) | |

(52) U.S. Cl.
CPC .. *H01L 27/1104* (2013.01); *H01L 21/823814* (2013.01); *H01L 21/823821* (2013.01); *H01L 29/0611* (2013.01); *H01L 29/0847* (2013.01); *H01L 29/66795* (2013.01); *H01L 29/7851* (2013.01)

(58) Field of Classification Search
CPC ........... H01L 27/1104; H01L 29/66795; H01L 29/7851; H01L 21/823814; H01L 29/0611; H01L 21/823821; H01L 29/0847; H01L 29/165; H01L 29/7848; H01L 21/823418
See application file for complete search history.

(56) References Cited

U.S. PATENT DOCUMENTS

| | | | | |
|---|---|---|---|---|
| 10,020,307 | B1* | 7/2018 | Holt | H01L 27/0924 |
| 2014/0252557 | A1* | 9/2014 | Flachowsky | H01L 21/3083 |
| | | | | 257/618 |
| 2016/0086943 | A1* | 3/2016 | Lee | H01L 21/022 |
| | | | | 257/401 |
| 2019/0164966 | A1* | 5/2019 | Wang | H01L 27/0922 |
| 2019/0378767 | A1* | 12/2019 | Bao | H01L 21/823878 |

\* cited by examiner

*Primary Examiner* — Karen Kusumakar
*Assistant Examiner* — Adam S Bowen
(74) *Attorney, Agent, or Firm* — Patterson & Sheridan, L.L.P.

(57) ABSTRACT

Certain aspects of the present disclosure provide a structure for source or drain in a fin field-effect transistors (finFET) to increase a breakdown voltage between adjacent finFETs in a semiconductor device. One example semiconductor device generally includes a plurality of finFETs, each of the finFETs comprising a source and a drain, wherein at least the source or the drain in at least one finFET of the plurality of finFETs has a profile with at least one rounded tip to increase a breakdown voltage between the at least one finFET and an adjacent finFET in the plurality of finFETs.

17 Claims, 11 Drawing Sheets

Y-Y' cross section

Y-Y' cross section

SRAM SOURCE-DRAIN STRUCTURE

FIELD OF THE DISCLOSURE

Certain aspects of the present disclosure relate generally to semiconductor devices, and more particularly, to a structure for a source and/or drain in a fin field-effect transistor (finFET) that increases a breakdown voltage between sources and/or drains of adjacent finFETs and reduces the likelihood of electrical shorts between adjacent finFETs.

DESCRIPTION OF RELATED ART

Mobile devices have become common in current society. The prevalence of these mobile devices is driven in part by the many functions that are now enabled on such devices. Demand for such functions increases processing capability requirements and generates a need for more powerful batteries. Within the limited space of the housing of the mobile device, batteries compete with the processing circuitry. These and other factors contribute to a continued miniaturization of components within the circuitry.

Miniaturization of the components impacts aspects of the processing circuitry including the memory transistors and other reactive elements in the processing circuitry. While miniaturization of components in mobile devices is easy for the consumer to appreciate as phones and other mobile devices become smaller and lighter and have longer battery times, miniaturization pressures are not limited to mobile devices. Computing devices ranging from mobile communication devices to desktop computers to servers and the like benefit from miniaturization efforts. In particular, almost all of these devices have various forms of memory such as dynamic random-access memory (DRAM) and static random-access memory (SRAM). A basic SRAM bit cell structure may have six transistors that form two cross-coupled inverters that store each memory bit. A typical SRAM uses metal-oxide semiconductor field-effect transistors (MOSFETs) for each of the six transistors. These SRAM MOSFETs may be implemented as fin field-effect transistors (finFETs), for example.

BRIEF SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Certain aspects of the present disclosure provide a semiconductor device. The semiconductor device generally includes a plurality of fin field-effect transistors (finFETs), each of the finFETs comprising a source and a drain, wherein at least the source or the drain in at least one finFET of the plurality of finFETs has a profile with at least one rounded tip to increase a breakdown voltage between the at least one finFET and an adjacent finFET in the plurality of finFETs.

Certain aspects of the present disclosure provide a method of fabricating a semiconductor device. The method generally includes forming a plurality of fin field-effect transistors (finFETs), each of the finFETs comprising a source and a drain. The method also includes forming at least one rounded tip in a profile of at least the source or the drain in at least one finFET of the plurality of finFETs to increase a breakdown voltage between the at least one finFET and an adjacent finFET in the plurality of finFETs.

Certain aspects of the present disclosure provide a semiconductor device. The semiconductor device generally includes a plurality of fin field-effect transistors (finFETs), each of the finFETs comprising a source and a drain, wherein at least the source or the drain in at least one finFET of the plurality of finFETs has at least one of a different size or a different height than the source or the drain of an adjacent finFET in the plurality of finFETs to increase a breakdown voltage between the at least one finFET and the adjacent finFET.

Certain aspects of the present disclosure provide a method of fabricating a semiconductor device. The method generally includes forming a plurality of fin field-effect transistors (finFETs), each of the finFETs comprising a source and a drain, such that at least the source or the drain in at least one finFET of the plurality of finFETs has at least one of a different size or a different height than the source or the drain of an adjacent finFET in the plurality of finFETs to increase a breakdown voltage between the at least one finFET and the adjacent finFET.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
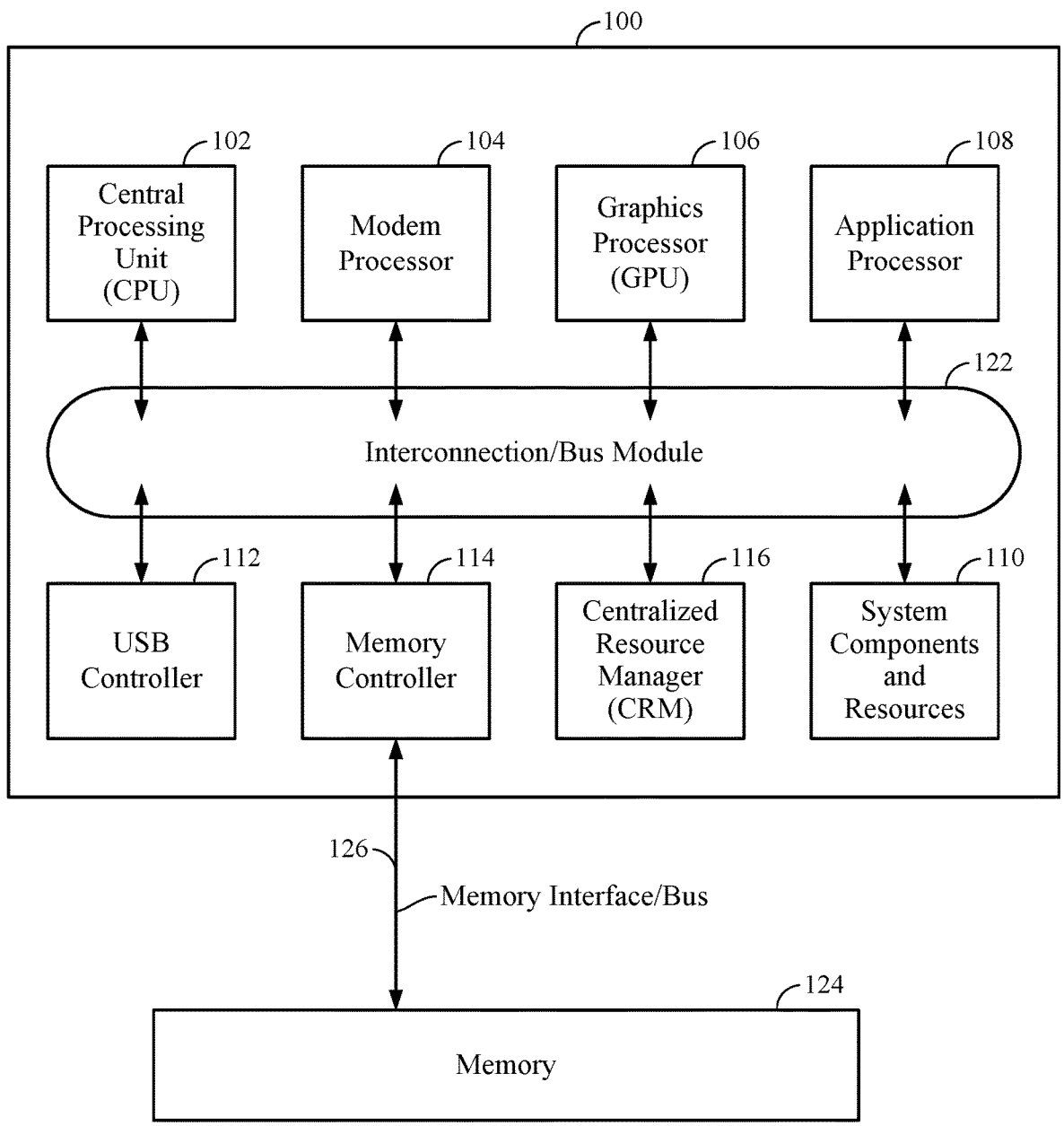
FIG. 1 is an illustration of an exemplary system-on-chip (SoC) integrated circuit design, in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

The various aspects will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

The term "computing device" may refer to any one or all of servers, personal computers, smartphones, cellular telephones, tablet computers, laptop computers, netbooks, ultra-books, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., ROM, RAM, flash, etc.), and resources (e.g., timers, voltage regulators, oscillators, etc.), any or all of which may be included in one or more cores.

A number of different types of memories and memory technologies are available or contemplated in the future, all of which are suitable for use with the various aspects of the present disclosure. Such memory technologies/types include dynamic random-access memory (DRAM), static random-access memory (SRAM), non-volatile random-access memory (NVRAM), flash memory (e.g., embedded multi-media card (eMNIC) flash), pseudostatic random-access memory (PSRAM), double data rate synchronous dynamic random-access memory (DDR SDRAM), and other random-access memory (RAM) and read-only memory (ROM) technologies known in the art. A DDR SDRAM memory may be a DDR type 1 SDRAM memory, DDR type 2 SDRAM memory, DDR type 3 SDRAM memory, or a DDR type 4 SDRAM memory. Each of the above-mentioned memory technologies includes, for example, elements suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Example Semiconductor Device

FIG. 1 illustrates example components and interconnections in a system-on-chip (SoC) 100 suitable for implementing various aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture (e.g., CoreConnect, AMBA, etc.). Communications may also be provided by advanced interconnects, such as high performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously.

The memory controller 114 may be a specialized hardware module configured to manage the flow of data to and from a memory 124 (e.g., a DRAM) via a memory interface/bus 126. Certain aspects of the present disclosure are generally directed to a memory implemented using negative capacitance material. For example, the memory 124 may be a DRAM implemented using negative capacitance material, improving the operation efficiency and/or reducing the size of the DRAM, as described in more detail herein.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Example SRAM Source-Drain Structure

As semiconductor devices scale down (e.g., to 7 nm and smaller processes), the space between n-channel metal-oxide semiconductor field-effect transistors (N-MOSFETs or NMOS transistors) and p-channel MOSFETs (P-MOSFETs or PMOS transistors) for high density SRAM decreases. The n-channel/p-channel space reduction may provide challenges in dual source/drain (SD) epitaxial (epi) patterning, which may increase SD epi-short related failures and repair rates. For instance, in some cases, the source and/or drain of a finFET may have a profile with a rhomboid or diamond shape. The sharp tips of the rhomboid-shaped SD may be responsible for a reduced spacing between finFETs, which may be sufficient to short the terminal regions of n-channel/p-channel finFETs (e.g., a short across the $V_{DD}$-connected source of the p-channel finFET and the $V_{REF}$-connected source of the n-channel finFET) and, thus, lead to a relatively low breakdown voltage.

Aspects of the present disclosure provide various example SD epi structures for finFETs to increase the breakdown voltage between the SDs of adjacent p-channel/n-channel finFETs. The increased breakdown voltage between SDs of adjacent p-channel/n-channel finFETs may reduce the likelihood of electrical shorting between the SDs. For instance, an example semiconductor device may include a finFET having a source and drain with a cross-sectional profile having at least one rounded tip. As another example, the source and/or drain of a finFET may have a different size and/or a different height relative to the source and/or drain of an adjacent finFET.

Figure 2A:
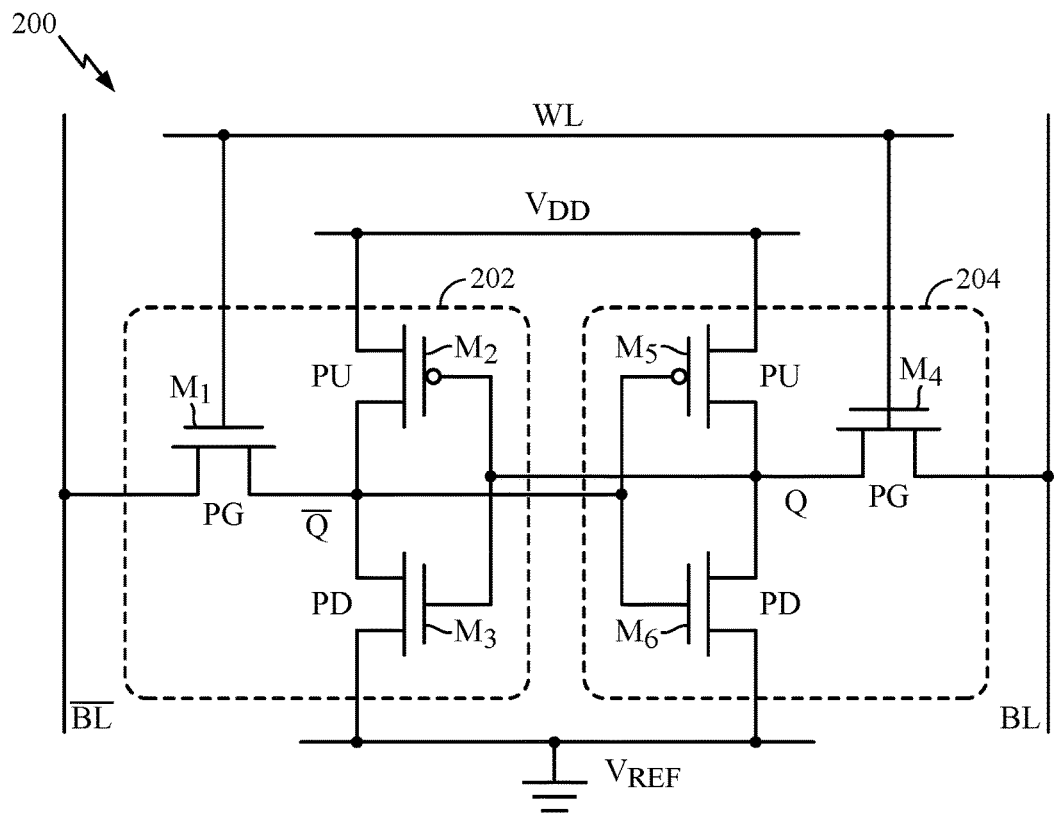
FIG. 2A is a schematic diagram of an example static random-access memory (SRAM) circuit, in accordance with certain aspects of the present disclosure.

FIG. 2A is an electrical schematic of an example bit cell of an SRAM 200 having a first inverter 202 and a second inverter 204, in accordance with certain aspects of the present disclosure. A word line WL couples to both inverters 202, 204. In particular, the word line WL couples to the first inverter 202 through a gate of a first pass gate (PG) transistor $M_1$ and couples to the second inverter 204 through a gate of a second PG transistor $M_4$. A bit line BL couples to a drain of the second PG transistor $M_4$. A bit line bar $\overline{BL}$ couples to a source of the first PG transistor $M_1$. The first inverter 202 includes a first pull up (PU) transistor $M_2$ and a first pull down (PD) transistor $M_3$. The second inverter 204 includes a second PU transistor $M_5$ and a second PD transistor $M_6$. A first power supply rail $V_{DD}$ couples to the sources of the first and second PU transistors $M_2$, $M_5$, and the sources of the PD transistors $M_3$, $M_6$ are coupled to a second power supply rail $V_{REF}$ (e.g., electrical ground).

Figure 2B:
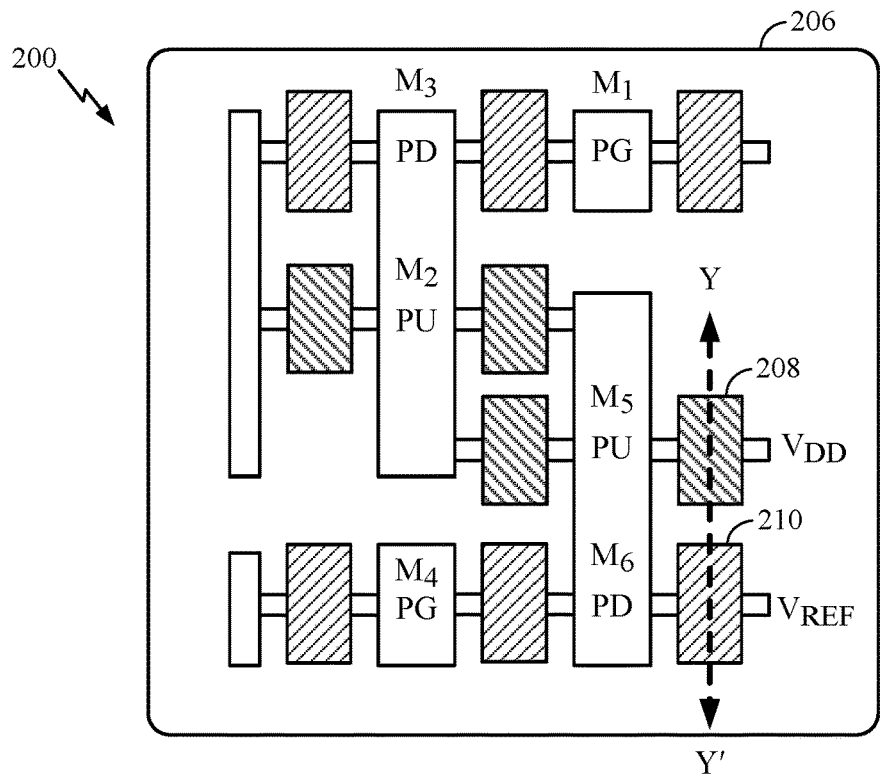
FIG. 2B is a diagram of an example top plan view of the circuit depicted in FIG. 2A, in accordance with certain aspects of the present disclosure.

The bit cell of SRAM 200 of FIG. 2A may have a physical layout as illustrated in FIG. 2B, in accordance with certain aspects of the present disclosure. The transistors $M_1$, $M_2$, $M_3$, $M_4$, $M_5$, and $M_6$ are positioned on a substrate 206. In this example, the source 208 of the second PU transistor $M_5$ may be formed as further described herein to increase the breakdown voltage relative to the source 210 of the second PD transistor $M_6$. As shown, the source 208 of $M_5$ is coupled to $V_{DD}$, whereas the source 210 of $M_6$ is coupled to $V_{REF}$. It should be appreciated that any of the adjacent sources and drains of the transistors $M_1$, $M_2$, $M_3$, $M_4$, $M_5$, and $M_6$ may be formed as further described herein to increase the breakdown voltage.

Figure 2C:
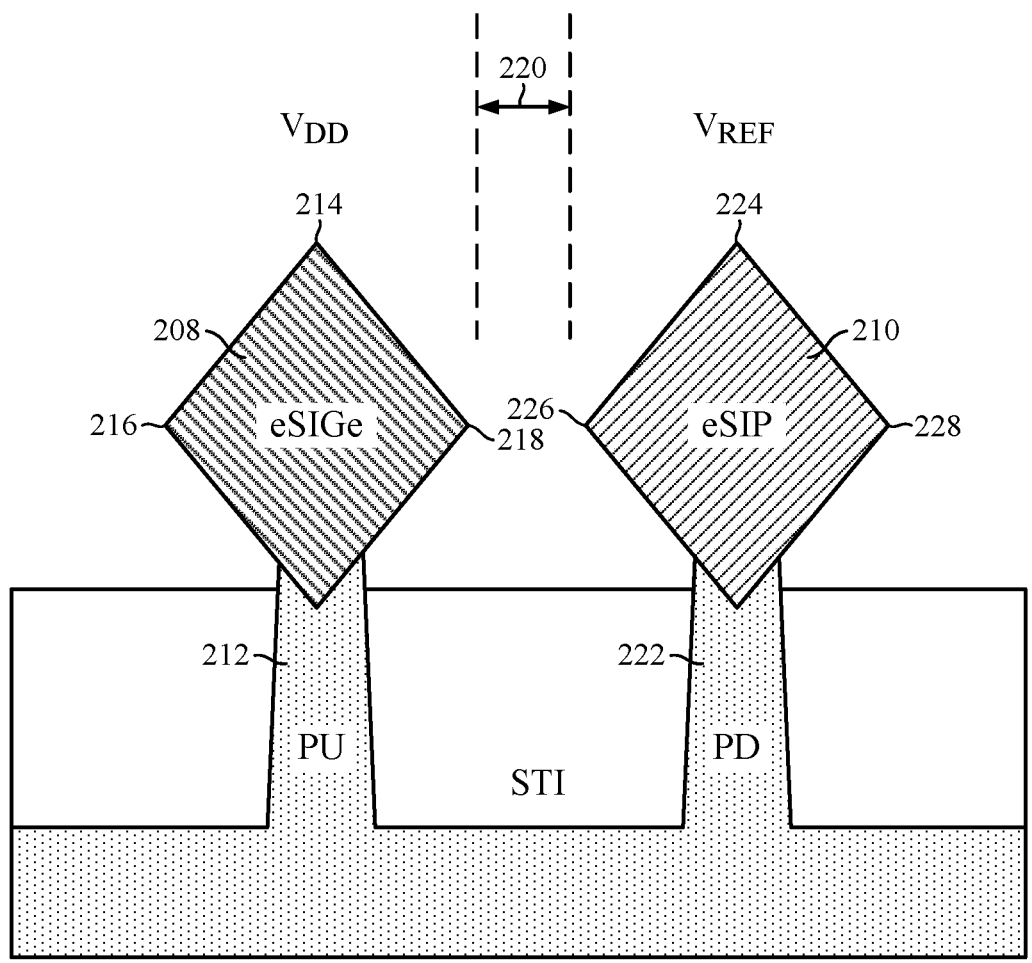
FIG. 2C is a cross-sectional view of terminal regions of adjacent transistors depicted in FIG. 2B, in accordance with certain aspects of the present disclosure.

FIG. 2C illustrates a cross-sectional view of the source 208 and source 210 of transistors $M_5$ and $M_6$, respectively, depicted in FIG. 2B, in accordance with certain aspects of the present disclosure. As shown, the cross-section of the source 208 and source 210 runs along the line Y-Y' illustrated in FIG. 2B. In this example, the source 208 may comprise an epitaxial semiconductor material (e.g., silicon-germanium SiGe) formed above a pin 212 of the PU transistor $M_5$. The source 208 may have a profile shaped as a rhomboid (or other parallelogram) having a top tip 214 and two lateral tips 216, 218. In this example, the tips 214, 216, and 218 have sharp ends and may not be rounded.

The source 210 may also comprise an epitaxial semiconductor material (e.g., a silicon-phosphorous (SiP) material) formed above a pin 222 of the PD transistor $M_6$. The source 210 may have a profile shaped as a rhomboid (or other parallelogram) having a top tip 224 and two lateral tips 226, 228. In this example, the tips 224, 226, and 228 have sharp ends and may not be rounded. The sharp tips of transistor $M_5$ and $M_6$ may lead to a relatively low breakdown voltage and problematic shorting between the terminals of adjacent transistors as previously described herein.

Figure 2D:
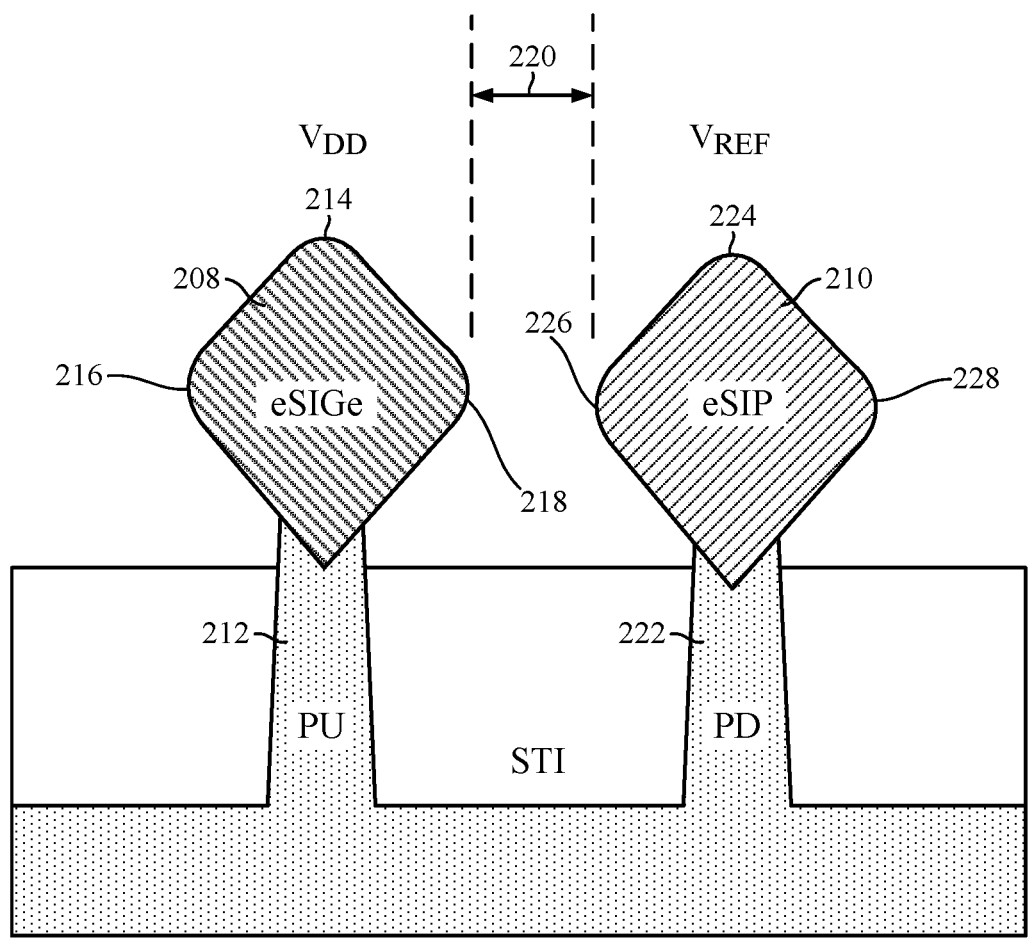
FIG. 2D is a cross-sectional view of terminal regions of adjacent transistors depicted in FIG. 2B, where the terminal regions have rounded tips, in accordance with certain aspects of the present disclosure.

FIG. 2D illustrates a cross-sectional view of the source 208 and source 210 of transistors $M_5$ and $M_6$, respectively, depicted in FIG. 2B, where the terminal regions have rounded tips to increase the breakdown voltage, in accordance with certain aspects of the present disclosure. As shown, the cross-section of the source 208 and source 210 runs along the line Y-Y' illustrated in FIG. 2B. In this example, the source 208 may comprise an epitaxial semiconductor material (e.g., silicon-germanium SiGe) formed above a pin 212 of the PU transistor $M_5$. The source 208 may have a profile shaped as a rhomboid (or other parallelogram) having a top tip 214 and two lateral tips 216, 218, and each of the tips 214, 216, and 218 may be rounded as shown. The rounded tips 214, 216, and 218 (in particular, lateral tip 218) may increase the distance 220 between the source 208 and source 210 allowing for an increased breakdown voltage between the source 208 and source 210.

In certain aspects, the source 210 may also comprise an epitaxial semiconductor material (e.g., a silicon-phosphorous (SiP) material) formed above a pin 222 of the PD transistor $M_6$. The source 210 may have a profile shaped as a rhomboid (or other parallelogram) having a top tip 224 and two lateral tips 226, 228, and each of the tips 224, 226, and 228 may be rounded. The rounded tips 224, 226, and 228 (in particular lateral tip 226) may increase the distance 220 between the source 208 and source 210 allowing for an increased breakdown voltage between the source 208 and source 210. In certain aspects, at least one of the adjacent tips 218 and 226 of the source 208 and source 210, respectively, may be rounded.

Figure 3:
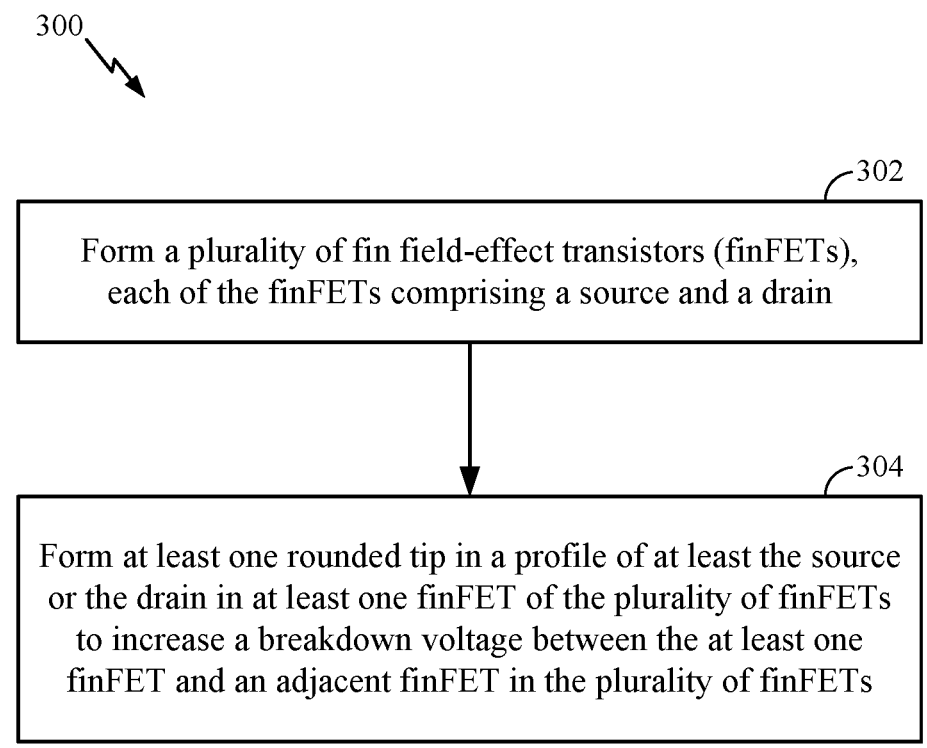
FIG. 3 is a flow diagram of example operations for fabricating a semiconductor device, in accordance with certain aspects of the present disclosure.

FIG. 3 is a flow diagram of example operations 300 for fabricating a semiconductor device having a source/drain structure that increases the breakdown voltage between the terminal regions (sources and/or drains) of adjacent finFETs, in accordance with certain aspects of the present disclosure. The operations 300 may be performed by a semiconductor processing chamber, for example. As an example, the semiconductor device may comprise an SRAM device, which may include the SRAM bit cell 200 illustrated in FIGS. 2A and 2B.

The operations 300 may begin, at block 302, by forming a plurality of finFETs, each of the finFETs comprising a source and a drain. At block 304, at least one rounded tip in a profile of at least the source or the drain in at least one finFET of the plurality of finFETs is formed to increase a breakdown voltage between the at least one finFET and an adjacent finFET in the plurality of finFETs.

In certain aspects, the at least one finFET may have an oxide layer formed above the at least the source or the drain. For instance, the at least one rounded tip may be formed by oxidizing the source or drain, which may consume a portion of the source or drain at the at least one tip.

In certain aspects, the at least one finFET may have a nitride layer formed above the at least the source or the drain. As an example, the nitride layer may provide a hard mask while growing the source or drain in the adjacent finFET as further described herein.

In other aspects, the at least one finFET may have a nitride layer and an oxide layer formed above the at least the source or the drain. For example, the at least one rounded tip may be formed by oxidizing the source or drain, and the hard mask of the nitride layer may be disposed above the oxide layer as further described herein.

In certain aspects, at least one rounded tip in a second profile of at least the source or the drain in the adjacent finFET in the plurality of finFETs may be formed to further increase the breakdown voltage between the at least one finFET and the adjacent finFET in the plurality of finFETs. For instance, each of the adjacent finFETs may have a source or drain that has a rounded tip as described herein.

In certain aspects, the plurality of finFETs may include a first finFET and a second finFET. The source and the drain of the first finFET may each have a first oxide layer and a nitride layer disposed thereon. The source and the drain of the second finFET may each have a second oxide layer disposed thereon. At least one of the source or the drain of the first finFET may be disposed adjacent to at least one of the source or the drain of the second finFET. The first finFET may be a pull-up transistor of an SRAM device, and the second finFET may be a pull-down transistor of the SRAM device.

FIGS. 4A-4H are cross-sectional views showing example operations for forming source/drain structures of adjacent finFETs, in accordance with certain aspects of the present disclosure. The operations may be performed by a semiconductor processing chamber, for example.

Figure 4A:
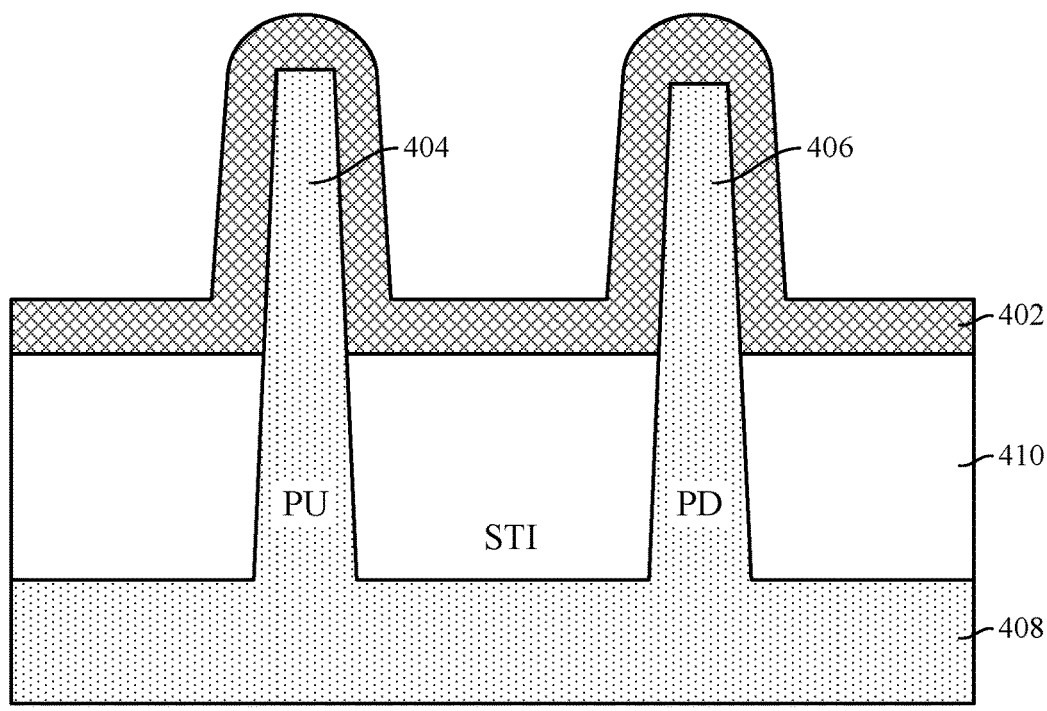
FIG. 4A is a cross-sectional view of example pins of adjacent transistor regions, in accordance with certain aspects of the present disclosure.

Referring to FIG. 4A, a first spacer layer 402 (e.g., a nitride layer) may be formed above a first pin 404 and a second pin 406 of adjacent finFETs to serve as a hard mask for the PD transistor during the fabrication of the source or drain in the PU transistor. The first and second pins 404, 406 may be formed from a semiconductor structure having shallow trench isolation (STI) 410 embedded therein. In this example, the first pin 404 may form the basis of a source or drain in a PU transistor (e.g., PU transistor $M_5$), whereas the second pin 406 may form the basis of a source or drain in a PD transistor (e.g., PD transistor $M_6$), as further described herein.

Figure 4B:
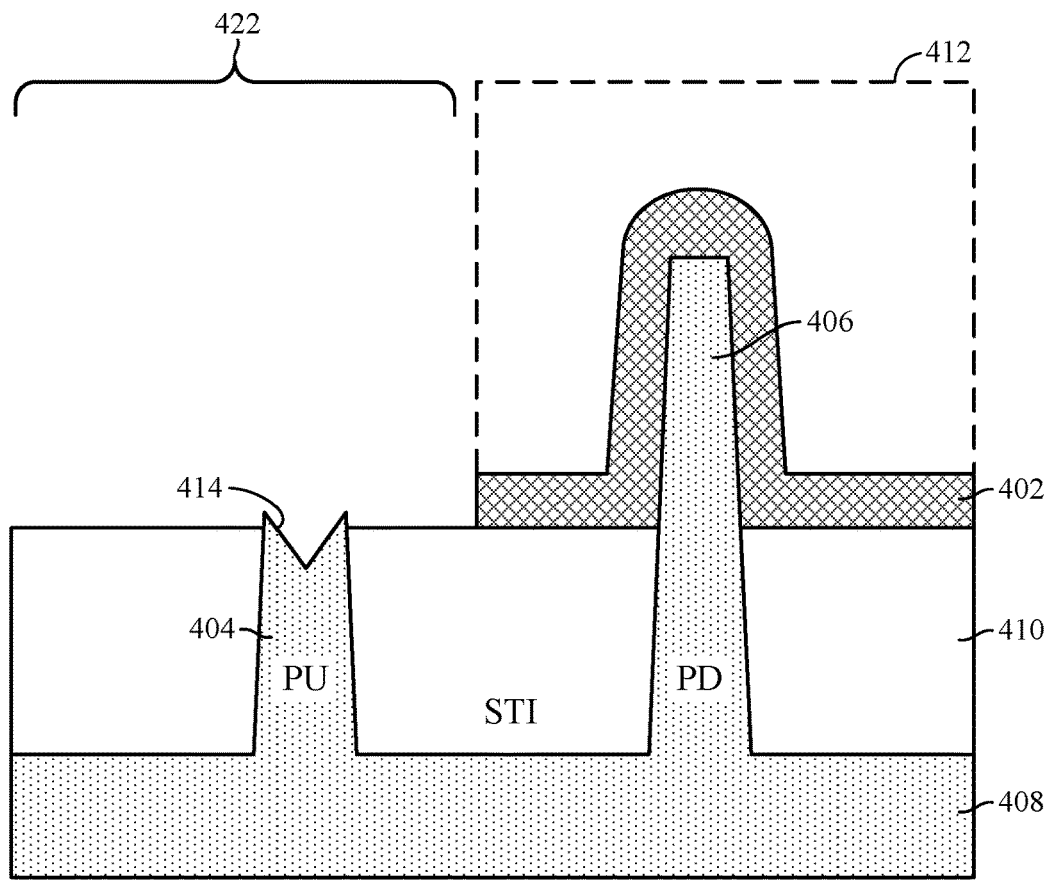
FIG. 4B is a cross-sectional view of a portion of a pin of the adjacent transistor regions removed, in accordance with certain aspects of the present disclosure.

As illustrated in FIG. 4B, PU transistor patterning may be performed by at least in part having the first spacer layer 402 disposed above the pin 406 to reduce or prevent epitaxial growth in the PD transistor region 412. The first spacer layer 402 may be removed within the PU transistor region 422, as well as a portion of the pin 404. For instance, the portion of the first spacer layer 402 and the pin portion may be removed using an etching process, such as a dry or wet etching process. A first cavity 414 may be formed in the remaining portion of the first pin 404 to allow a source/drain in the PU transistor to grow using an epitaxy process as further described herein.

Figure 4C:
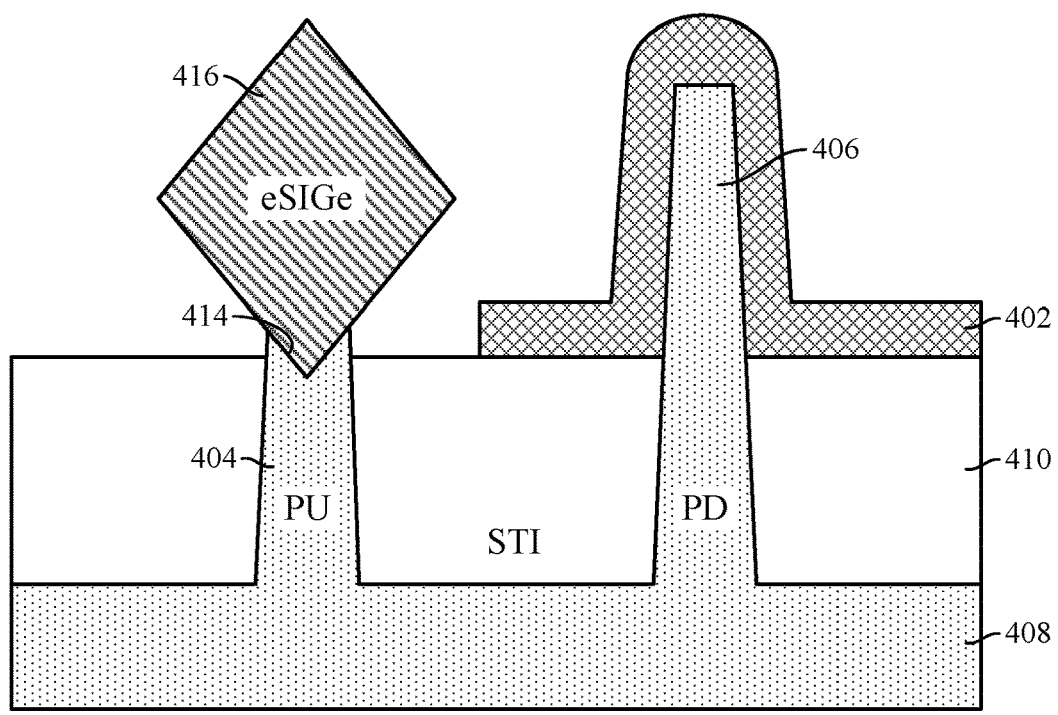
FIG. 4C is a cross-sectional view of an epitaxial semiconductor material grown over the removed pin portion, in accordance with certain aspects of the present disclosure.

Referring to FIG. 4C, an epitaxial semiconductor material (e.g., silicon-germanium (SiGe) material, boron-doped silicon-germanium material, or other semiconductors suitable for a p-channel finFET) is grown in the first cavity 414 to form a terminal 416 in the PU transistor. Due to the shape of the first cavity 414, the terminal 416 may be grown into a rhomboid shape (or other parallelogram) having sharp lateral tips, which may be rounded as further described herein.

Figure 4D:
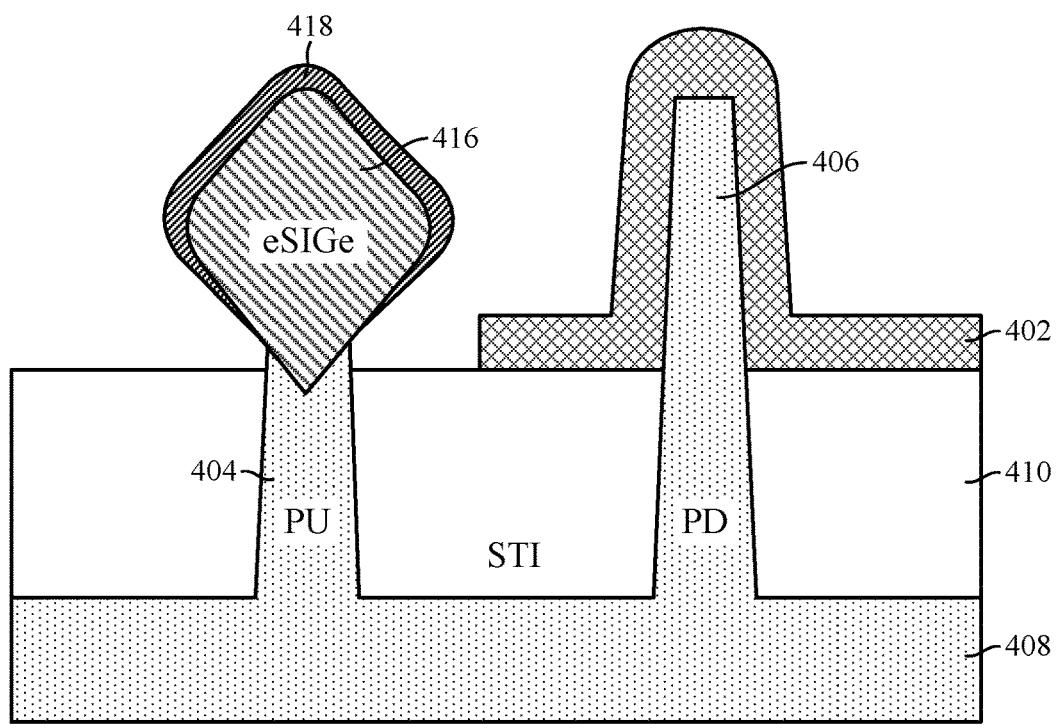
FIG. 4D is a cross-sectional view of an oxide layer formed above the epitaxial semiconductor material, in accordance with certain aspects of the present disclosure.

As shown in FIG. 4D, a first oxide layer 418 may be formed above the terminal 416 to round the sharp tips of the terminal 416. The oxidation of the semiconductor material (e.g., the eSiGe) may consume portions of the sharp tips to form rounded tips that increase the breakdown voltage between sources and/or drains of adjacent transistors.

Figure 4E:
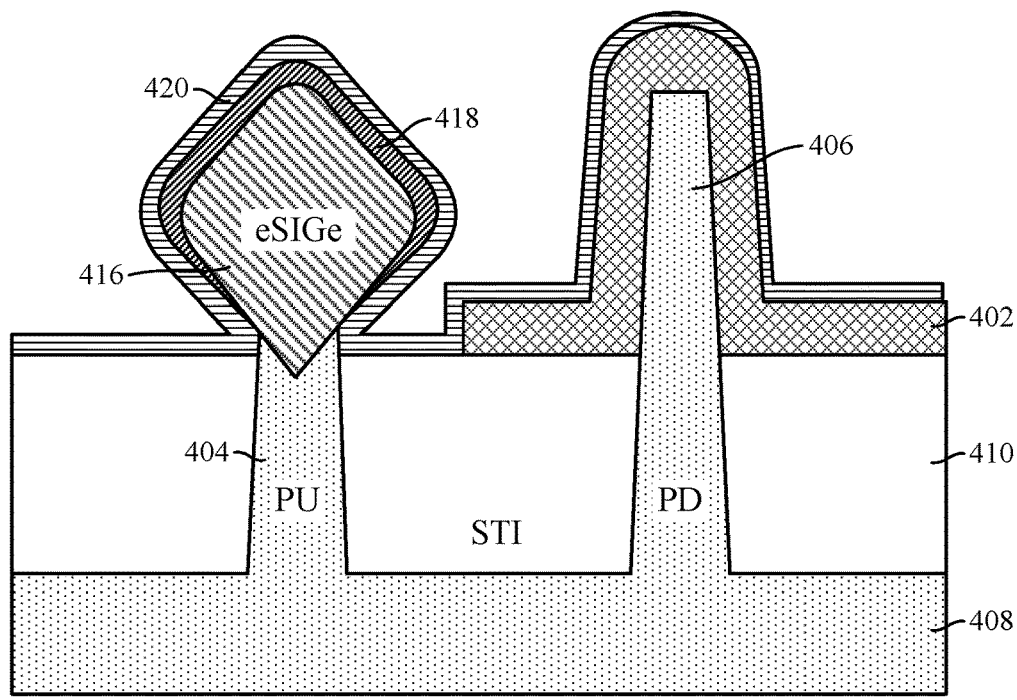
FIG. 4E is a cross-sectional view of a spacer layer formed above the oxide layer, in accordance with certain aspects of the present disclosure.

Referring to FIG. 4E, a second spacer layer 420 (e.g., a nitride layer) may be formed above the first pin 404 and the second pin 406, such that the second spacer layer 420 may be formed above the first oxide layer 418 and the first spacer layer 402. The second spacer layer 420 may serve as a hard mask above the PU transistor region 422 during the fabrication of the terminal in the PD transistor to reduce or prevent any epitaxial growth within the PD transistor region 412.

Figure 4F:
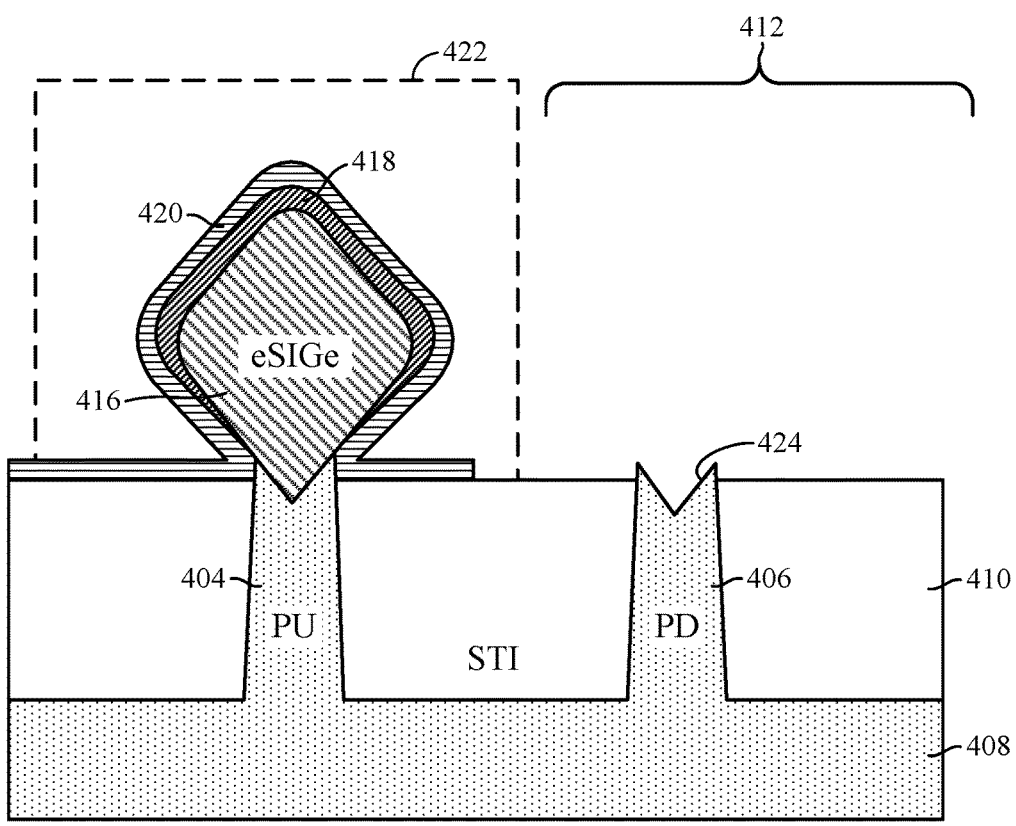
FIG. 4F is a cross-sectional view of a portion of another pin of the adjacent transistor regions removed, in accordance with certain aspects of the present disclosure.

As illustrated in FIG. 4F, PD transistor patterning may be performed by at least in part having the second spacer layer 420 disposed above the terminal 416 to reduce or prevent any epitaxial growth in the PU transistor region 422. The first spacer layer 402 and second spacer layer 420 may be removed in the PD transistor region 412. For instance, the first and second spacer layers 402, 420 and a portion of the pin 406 may be removed using an etching process, such as a dry or wet etching process. A second cavity 424 may be formed in a remaining portion of the second pin 406 to allow a source/drain in the PD transistor to grow using an epitaxy process as further described herein.

Figure 4G:
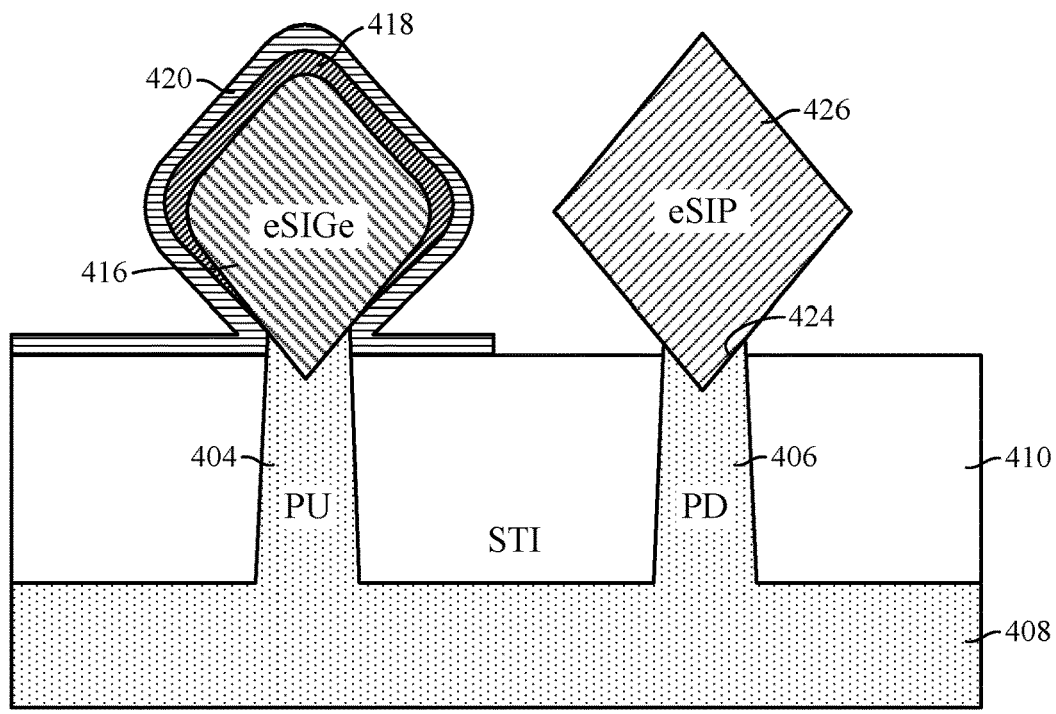
FIG. 4G is a cross-sectional view of another epitaxial semiconductor material grown over the other removed pin portion, in accordance with certain aspects of the present disclosure.

As depicted in FIG. 4G, an epitaxial semiconductor material (e.g., silicon-phosphorous (SiP) material) or other semiconductors suitable for an n-channel finFET) is grown in the second cavity 424 to form a source 426 in the PD transistor. The source 426 may be grown into a rhomboid shape (or other parallelogram) having sharp tips, which may be rounded as further described herein.

Figure 4H:
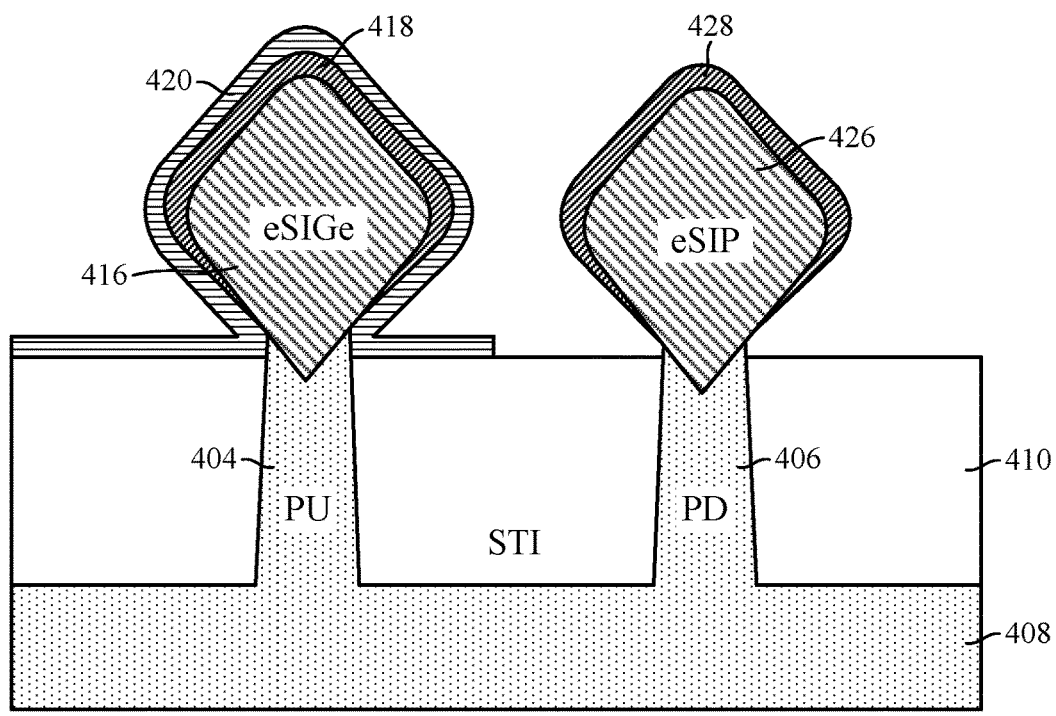
FIG. 4H is a cross-sectional view of another oxide layer formed above the other epitaxial semiconductor material, in accordance with certain aspects of the present disclosure.

Referring to FIG. 4H, a second oxide layer 428 may be formed above the source 426 to round the sharp tips of the terminal 426. The oxidation of the semiconductor material (e.g., eSiP) may consume portions of the sharp tips to form rounded tips that increase the breakdown voltage between sources and/or drains of adjacent transistors.

In certain aspects, the terminal regions of adjacent finFETs may have different heights or different sizes relative to each other in order to increase the breakdown voltage. In other aspects, the terminal regions of adjacent finFETs may have rounded tips as described herein, different heights, different sizes, or a combination thereof to increase the breakdown voltage between the terminal regions.

Figure 5:
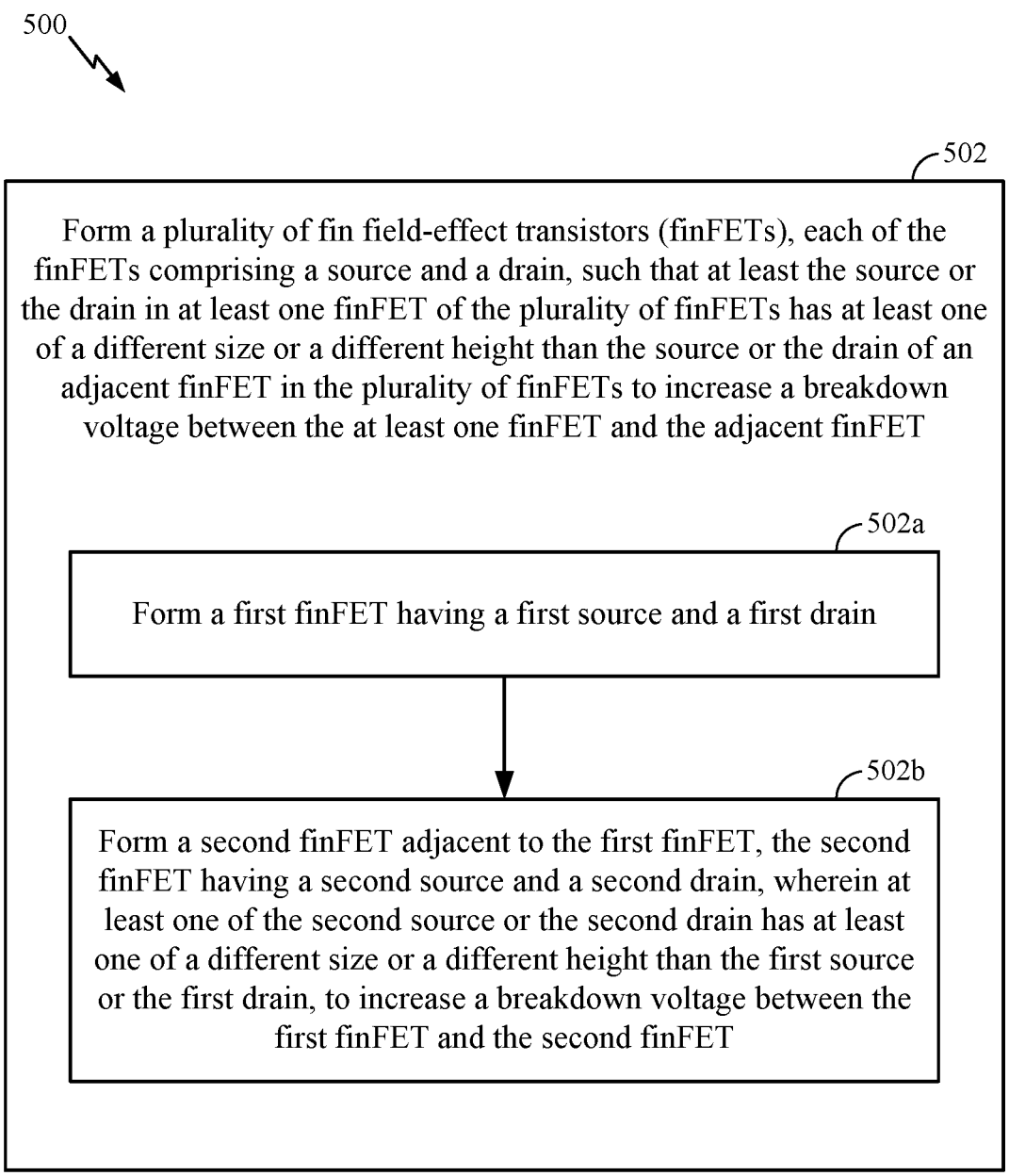
FIG. 5 is a flow diagram of example operations for fabricating a semiconductor device comprising transistors having terminal regions with different heights and/or different sizes, in accordance with certain aspects of the present disclosure.

FIG. 5 is a flow diagram of example operations 500 for fabricating a semiconductor device with sources and/or drains with different heights or sizes, in accordance with certain aspects of the present disclosure. The operations 500 may be performed by a semiconductor processing chamber, for example.

The operations 500 may begin, at block 502, by forming a plurality of fin field-effect transistors (finFETs), each of the finFETs comprising a source and a drain, such that at least the source or the drain in at least one finFET of the plurality of finFETs has at least one of a different size or a different height than the source or the drain of an adjacent finFET in the plurality of finFETs to increase a breakdown voltage between the at least one finFET and the adjacent finFET. Forming the finFETs at block 502 may include, at block 502a, forming a first finFET having a first source and a first drain and, at block 502b, forming a second finFET adjacent to the first finFET, the second finFET having a second source and a second drain, wherein at least one of the second source or the second drain has at least one of a different size or a different height than the first source or the first drain, to increase a breakdown voltage between the first finFET and the second finFET.

Figure 6:
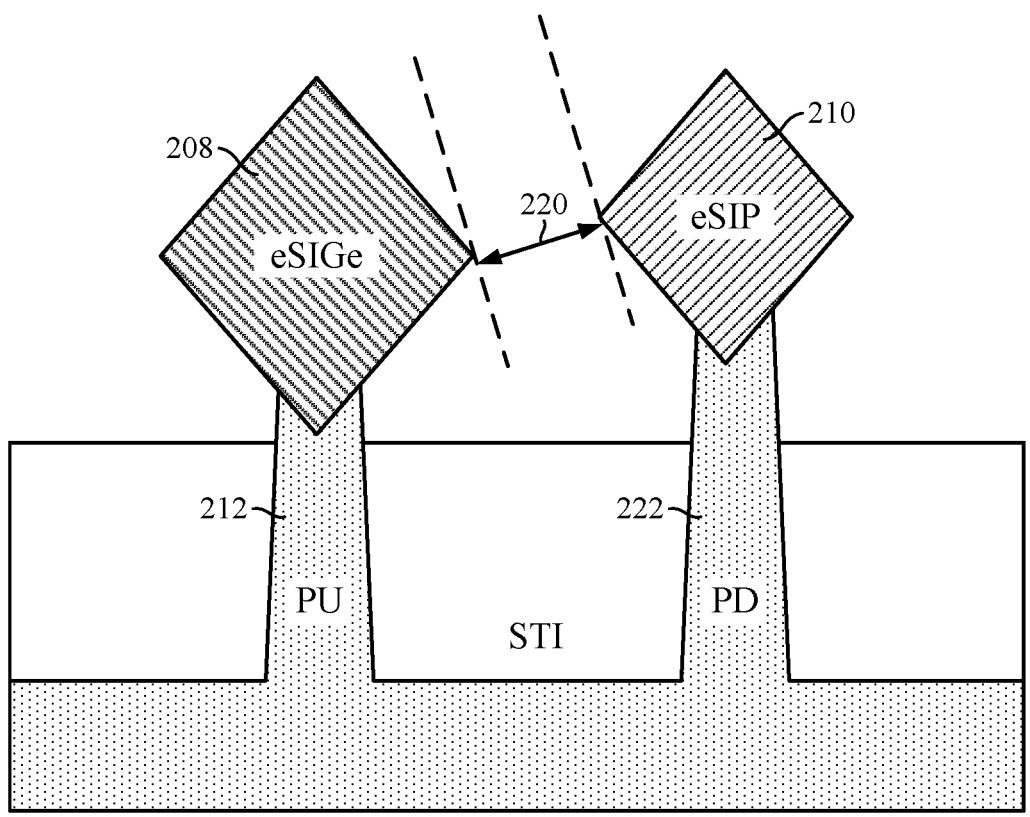
FIG. 6 is a cross-sectional view of the terminal regions of transistors depicted in FIG. 2B having different heights and different sizes, in accordance with certain aspects of the present disclosure.

FIG. 6 is a cross-sectional view of the source 208 and source 210 of transistors $M_5$ and $M_6$, respectively, depicted in FIG. 2B having a different height and a different size, in accordance with certain aspects of the present disclosure. As shown, the source 210 may be elevated on the second pin 222 relative to the source 208 disposed on the first pin 212. The greater height of the source 210 relative to the source 208 may increase the distance 220 between the adjacent tips of the source 208 and source 210, which may lead to an increased breakdown voltage. The height of the source 210 may be adjusted according to the height of the cavity formed in the second pin 222 (e.g., the second cavity 424 illustrated in FIGS. 4F and 4G). For instance, the height of the source 210 may be increased by removing less of the pin 222 while forming the cavity, and in other cases, the height of the source 210 may be decreased by removing more of the pin 222 while forming the cavity. For certain aspects, the height of the source 208 may be similarly adjusted while forming the cavity in the first pin 212 (e.g., the first cavity 414 illustrated in FIGS. 4B and 4C) to increase the breakdown voltage.

In certain aspects, the source 210 may be grown as described herein with respect to FIG. 4G such that the source 210 has a smaller size than the source 208. The size of the source 210 may be adjusted according to the size of the cavity formed in the second pin 222 (e.g., the second cavity 424 illustrated in FIGS. 4F and 4G). For instance, the size of the source 210 may be increased by increasing the size of the cavity formed in the second pin 222, and in other cases, the size of the source 210 may be decreased by decreasing the size of the cavity formed in the second pin 222. For certain aspects, the size of the source 208 may be similarly adjusted while forming the cavity in the first pin 212 (e.g., the first cavity 414 illustrated in FIGS. 4B and 4C) to increase the breakdown voltage.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein. The algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The invention claimed is:

1. A semiconductor device comprising a plurality of fin field-effect transistors (finFETs), each of the plurality of finFETs comprising a source and a drain, wherein:
   at least the source or the drain in at least one finFET of the plurality of finFETs has a profile with a plurality of rounded tips to increase a breakdown voltage between the at least one finFET and an adjacent finFET in the plurality of finFETs;
   each of the plurality of rounded tips is oxidized;
   the profile is a rhomboid shape having a top tip and two lateral tips; and
   the plurality of rounded tips comprises the top tip and the two lateral tips.

2. The semiconductor device of claim 1, wherein the at least one finFET has an oxide layer formed above the at least the source or the drain.

3. The semiconductor device of claim 1, wherein the at least one finFET has a nitride layer formed above the at least the source or the drain.

4. The semiconductor device of claim 1, wherein the at least one finFET has a nitride layer and an oxide layer formed above the at least the source or the drain.

5. The semiconductor device of claim 1, wherein:
   the plurality of finFETs comprises a first finFET and a second finFET;
   the source and the drain of the first finFET each have a first oxide layer and a nitride layer disposed thereon;
   the source and the drain of the second finFET each have a second oxide layer disposed thereon; and
   at least one of the source or the drain of the first finFET is disposed adjacent to at least one of the source or the drain of the second finFET.

6. The semiconductor device of claim 5, wherein the semiconductor device comprises a static random-access memory (SRAM) device, wherein the first finFET is a pull-up transistor of the SRAM device, and wherein the second finFET is a pull-down transistor of the SRAM device.

7. The semiconductor device of claim 5, wherein the at least one of the source or the drain of the first finFET is disposed higher relative to the at least one of the source or the drain of the second finFET.

8. The semiconductor device of claim 5, wherein the at least one of the source or the drain of the first finFET is smaller relative to the at least one of the source or the drain of the second finFET.

9. The semiconductor device of claim 5, wherein the at least one of the source or the drain of the first finFET comprises a silicon-germanium material, and wherein the at least one of the source or the drain of the second finFET comprises a silicon-phosphorous material.

10. The semiconductor device of claim 1, wherein:
    the semiconductor device comprises a static random-access memory (SRAM) device;
    the plurality of finFETs comprises two pull-down (PD) transistors, two pull-up (PU) transistors, and two pass-gate (PG) transistors; and
    the at least the source or the drain having the profile with the plurality of rounded tips increases a spacing between at least one of the PD transistors and at least one of the PU transistors.

11. A method of fabricating a semiconductor device, comprising:
    forming a first fin field-effect transistor (finFET) comprising a first source and a first drain;
    forming a second finFET comprising a second source and a second drain;
    forming a first plurality of rounded tips in a profile of at least the first source or the first drain, wherein forming the first plurality of rounded tips comprises forming a first oxide layer above at least the first source or the first drain;
    forming a nitride layer above the first oxide layer; and
    after forming the nitride layer, forming a second plurality of rounded tips in a profile of at least the second source or the second drain, wherein forming the second plurality of rounded tips comprises forming a second oxide layer above at least the second source or the second drain.

12. The method of claim 11, wherein forming at least one of the first or the second finFET comprises forming at least the first or the second source or the first or the second drain in the at least one of the first or the second finFET higher relative to at least a source or a drain in an adjacent finFET.

13. The method of claim 11, wherein forming at least one of the first or the second finFET comprises forming at least the first or the second source or the first or the second drain in the at least one of the first or the second finFET smaller relative to at least a source or a drain in an adjacent finFET.

14. A semiconductor device comprising a plurality of fin field-effect transistors (finFETs), each of the plurality of finFETs comprising a source and a drain, wherein:
    at least the source or the drain in at least one finFET of the plurality of finFETs has a profile with a plurality of rounded tips and with at least one of a different size or a different height than the source or the drain of an adjacent finFET in the plurality of finFETs to increase a breakdown voltage between the at least one finFET and the adjacent finFET;

each of the plurality of rounded tips is oxidized;

the profile is a rhomboid shape having a top tip and two lateral tips; and the plurality of rounded tips comprises the top tip and the two lateral tips.

15. The semiconductor device of claim 14, wherein the at least one finFET has an oxide layer formed above the at least the source or the drain.

16. The semiconductor device of claim 14, wherein the source or the drain of the at least one finFET is disposed higher and is smaller relative to the source or the drain of the adjacent finFET.

17. The semiconductor device of claim 14, wherein the source or the drain of the at least one finFET is disposed lower and is smaller relative to the source or the drain of the adjacent finFET.

* * * * *